United States Patent
Chang et al.

(10) Patent No.: US 8,436,258 B2
(45) Date of Patent: May 7, 2013

(54) ELECTROMAGNETIC SHIELDING ARTICLE AND METHOD FOR MANUFACTURING SAME

(75) Inventors: Hsin-Pei Chang, Tu-Cheng (TW);
Wen-Rong Chen, Tu-Cheng (TW);
Huann-Wu Chiang, Tu-Cheng (TW);
Cheng-Shi Chen, Tu-Cheng (TW);
Chuang Ma, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 301 days.

(21) Appl. No.: 13/032,728

(22) Filed: Feb. 23, 2011

(65) Prior Publication Data

US 2012/0118626 A1 May 17, 2012

(30) Foreign Application Priority Data

Nov. 11, 2010 (CN) .......................... 2010 1 0539838

(51) Int. Cl.
*H05K 9/00* (2006.01)

(52) U.S. Cl.
USPC ............ 174/386; 174/388; 427/404; 427/455

(58) Field of Classification Search .................. 174/386, 174/388; 427/404, 455; 361/816, 818
See application file for complete search history.

(56) References Cited

U.S. PATENT DOCUMENTS

| | | | |
|---|---|---|---|
| 6,864,418 B2* | 3/2005 | Wang et al. ................... 174/391 |
| 2004/0256131 A1* | 12/2004 | Wang et al. ................... 174/350 |
| 2009/0104572 A1* | 4/2009 | Gao et al. ...................... 430/348 |
| 2009/0297739 A1* | 12/2009 | Baily et al. ................. 428/32.74 |
| 2011/0151153 A1* | 6/2011 | Felder et al. ............... 428/32.86 |
| 2011/0151214 A1* | 6/2011 | Bailey et al. .................. 428/209 |
| 2012/0156596 A1* | 6/2012 | Kominato et al. ................ 430/5 |

* cited by examiner

*Primary Examiner* — Hung Ngo
(74) *Attorney, Agent, or Firm* — Altis Law Group, Inc.

(57) ABSTRACT

An electromagnetic shielding article includes a plastic substrate; a nickel vanadium layer deposited on the plastic substrate; an electromagnetic shielding layer deposited on the plastic substrate; and a protection layer deposited on the electromagnetic shielding layer. A method for manufacturing the electromagnetic shielding article comprising steps of: providing a plastic substrate; depositing a nickel vanadium layer on the plastic substrate by radio-frequency induction plasma spraying process; depositing an electromagnetic shielding layer on the nickel vanadium layer; and depositing a protection layer on the electromagnetic shielding layer.

18 Claims, 1 Drawing Sheet

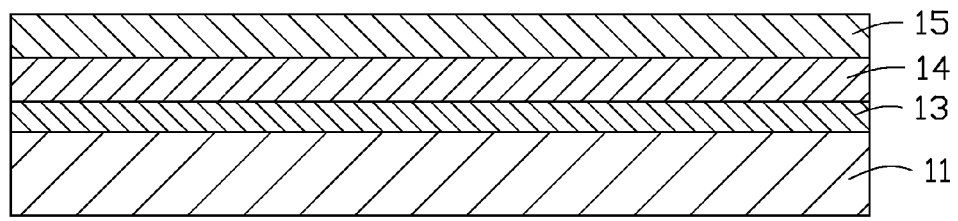

ELECTROMAGNETIC SHIELDING ARTICLE AND METHOD FOR MANUFACTURING SAME

CROSS-REFERENCE TO RELATED APPLICATIONS

The present application is related to co-pending U.S. patent application Ser. Nos. 13/032,724, 13/032,725, each entitled "ELECTROMAGNETIC SHIELDING ARTICLE AND METHOD FOR MANUFACTURING SAME", by Zhang et al. These applications have the same assignee as the present application and have been concurrently filed herewith. The above-identified applications are incorporated herein by reference.

BACKGROUND

1. Technical Field

The exemplary disclosure generally relates to electromagnetic shielding articles and methods for manufacturing the electromagnetic shielding articles.

2. Description of Related Art

The operation of portable electronic devices such as mobile telephone, televisions, radios, computers, medical instruments, business machines, communications equipment, and the like generates electromagnetic radiation within the electronic circuitry of the equipment, and is termed "electromagnetic interference" or "EMI". EMI is known to interfere with the operation of other nearby electronic devices.

To attenuate EMI effects, shielding can having the capability of absorbing and/or reflecting EMI energy may be employed to confine the EMI energy within a source device, and to insulate that device or other "target" devices from other source devices. A typical shielding may comprise a plastic substrate and an electrically-conductive layer coated on the plastic substrate. However, it is difficult to coat an electrically-conductive layer on a plastic substrate.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary electromagnetic shielding article and method for manufacturing the electromagnetic shielding article. Moreover, in the drawings like reference numerals designate corresponding parts throughout the several views. Wherever possible, the same reference numbers are used throughout the drawings to refer to the same or like elements of an exemplary embodiment.

The FIGURE is a cross-sectional view of an exemplary embodiment of an electromagnetic shielding article.

DETAILED DESCRIPTION

Referring to FIGURE, an exemplary embodiment of an electromagnetic shielding article 10 includes a plastic substrate 11, a nickel-vanadium (NiV) layer 13 deposited on the plastic substrate 11 by radio-frequency induction plasma spraying process, an electromagnetic shielding layer 14 deposited on the nickel vanadium layer 13 by magnetron sputtering process and a protection layer 15 deposited on the electromagnetic shielding layer 14 by magnetron sputtering process.

The nickel vanadium layer 13 has a thickness between about 50 nanometers and about 300 nanometers. The electromagnetic shielding layer 14 is made of metal, such as copper, silver. The electromagnetic shielding layer 14 has a thickness between about 100 nanometers and about 400 nanometers. The copper and the silver have a low resistivity, so the electromagnetic shielding layer 14 made from the copper and the silver provides affective electromagnetic shielding. The protection layer 15 improves the corrosion resistance of the electromagnetic shielding article 10. In this exemplary embodiment, the protection layer 15 is a stainless steel layer and has a thickness between about 50 nanometers and about 300 nanometers. The protection layer 15 can improve the corrosion resistance of the electromagnetic shielding article 10, to prevent losing electromagnetic shielding functionality.

A method for manufacturing the electromagnetic shielding article 10 may include at least the following steps.

A plastic substrate 11 is provided. The plastic substrate 11 may be made of plastic, such as polyvinyl chloride, polyethylene, polystyrene, polypropylene, polycarbonate, cellulose nitrate, phenol-formaldehyde, polyurethane, epoxy resin, by injection molding process.

A vacuum coating machine (not shown) is provided. The vacuum coating machine may include a plasma cleaning chamber, a radio-frequency induction plasma spraying chamber, a first metal spraying chamber, a second metal spraying chamber, a transmission device and a rotating bracket mounted on the transmission device.

The plastic substrate 11 is cleaned by argon plasma cleaning. The plastic substrate 11 is retained on the rotating bracket, and then is moved into the plasma cleaning chamber. The vacuum level inside the plasma cleaning chamber is set to $5.0 \times 10-3$ Pa, pure argon is floated into the plasma cleaning chamber at a flux of about 100 Standard Cubic Centimeters per Minute (sccm) to 350 sccm, and in this exemplary embodiment is at about 270 sccm. An ion source in the plasma cleaning chamber is started at a power of about 700 W to about 1000 W for about 0.5 minutes to about 10 minutes, to produce argon ions. In this exemplary embodiment, the ion source in the plasma cleaning chamber is started at a power about 900 W for about 1 minute. The argon ions are then emitted on the plastic substrate 11. So the plastic substrate 11 is washed by argon plasma, to remove the grease or dirt.

A nickel vanadium layer 13 is deposited on the plastic substrate 11 by radio-frequency induction plasma spraying process. The substrate 11 is moved into the radio-frequency induction plasma spraying chamber by the transmission device, and in this exemplary embodiment, the speed of the transmission device is about 0.5 meters per second (m/s) to 2.0 m/s. The argon is floated into the radio-frequency induction plasma spraying chamber at a flux of about 100 sccm to 300 sccm, and in this exemplary embodiment is at about 180 sccm. The temperature inside the radio-frequency induction plasma spraying chamber is heated to about 50° C. to about 150° C., and in this exemplary embodiment is at about 80° C. A nickel vanadium target in the radio-frequency induction plasma spraying chamber is evaporated at a power of about 200 W to about 1500 W, in this embodiment at about 800 W, to deposit the nickel vanadium layer 13 on the plastic substrate 11. The atomic nickel content in the nickel vanadium target is between about 70~90 wt %, and in this exemplary embodiment is about 80 wt %.

An electromagnetic shielding layer 14 is deposited on the nickel vanadium layer 13 by magnetron sputtering process. The substrate 11 is moved into the first metal spraying chamber by the transmission device, and in this exemplary embodiment, the speed of the transmission device is about 0.5 m/s to 2.0 m/s. The temperature inside the first metal spraying chamber is set to 50~150° C. Argon is floated into the first metal spraying chamber at a flux of about 100 sccm to about 300 sccm. A copper or silver target in the first metal spraying chamber is evaporated at a power from 500 W to 1500 W, to deposit the electromagnetic shielding layer 14 on the nickel vanadium layer 13. In this exemplary embodiment, the copper or silver target in the first metal spraying chamber is evaporated at a power from 1000 W, A protection layer 15 is deposited on the electromagnetic shielding layer 14 by magnetron sputtering process. The substrate 11 is moved into the second metal spraying chamber by the transmission device, and in this exemplary embodiment, the speed of the transmission device is about 0.5 m/s to 2.0 m/s. The temperature inside the second metal spraying chamber is set to 50~150° C. Argon is floated into the second metal spraying chamber at a flux of about 75 sccm to about 150 sccm. A stainless steel target in the second metal spraying chamber is evaporated at a power from 1 kW to 10 kW, in this exemplary embodiment is at 1000 W, to deposit the protection layer 15 on the electromagnetic shielding layer 14.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An electromagnetic shielding article, comprising:
a plastic substrate;
a nickel vanadium layer deposited on the plastic substrate;
an electromagnetic shielding layer deposited on the nickel vanadium layer; and
a protection layer deposited on the electromagnetic shielding layer.

2. The electromagnetic shielding article as claimed in claim 1, wherein the nickel vanadium layer is deposited on the plastic substrate by radio-frequency induction plasma spraying process and has a thickness between about 50 nanometers and about 300 nanometers.

3. The electromagnetic shielding article as claimed in claim 1, wherein the electromagnetic shielding layer is made of metal.

4. The electromagnetic shielding article as claimed in claim 3, wherein the metal is copper or silver.

5. The electromagnetic shielding article as claimed in claim 1, wherein the electromagnetic shielding layer has a thickness between about 100 nanometers and about 400 nanometers.

6. The electromagnetic shielding article as claimed in claim 1, wherein the protection layer is a stainless steel layer.

7. The electromagnetic shielding article as claimed in claim 6, wherein the protection layer has a thickness between about 50 nanometers and about 300 nanometers.

8. A method for manufacturing an electromagnetic shielding article comprising steps of:
providing a plastic substrate;
depositing a nickel vanadium layer on the plastic substrate;
depositing an electromagnetic shielding layer on the nickel vanadium layer; and
depositing a protection layer on the electromagnetic shielding layer.

9. The method of claim 8, wherein the step of depositing the nickel vanadium layer is done by radio-frequency induction plasma spraying process.

10. The method of claim 9, wherein the plastic substrate is made of plastic.

11. The method of claim 10, wherein the plastic is polyvinyl chloride, polyethylene, polystyrene, polypropylene, polycarbonate, cellulose nitrate, phenol-formaldehyde, polyurethane, or epoxide resin.

12. The method of claim 9, wherein during depositing the nickel vanadium layer on the plastic substrate, the plastic substrate is retained in a radio-frequency induction plasma spraying chamber, argon is floated into the radio-frequency induction plasma spraying chamber at a flux of about 100 sccm to 300 sccm; the temperature inside the radio-frequency induction plasma spraying chamber is heated to 50 to 150° C.; a nickel vanadium target in the radio-frequency induction plasma spraying chamber is evaporated at a power of about 200 W to about 1500 W, to deposit the nickel vanadium layer on the plastic substrate.

13. The method of claim 12, wherein the atomic nickel content in the nickel vanadium target is between about 70~90 wt %.

14. The method of claim 12, wherein the atomic nickel content in the nickel vanadium target is about 80 wt %.

15. The method of claim 9, wherein during depositing the electromagnetic shielding layer on the nickel vanadium layer, the plastic substrate is retained in a first metal spraying chamber, the temperature inside the first metal spraying chamber is set to 50~150° C.; argon is floated into the first metal spraying chamber at a flux of about 100 sccm to about 300 sccm; a copper or silver target in the first metal spraying chamber is evaporated at a power from 500 W to 1500 W, to deposit the electromagnetic shielding layer on the nickel vanadium layer.

16. The method of claim 9, wherein during depositing the protection layer on the electromagnetic shielding layer, the plastic substrate is retained in a second metal spraying chamber, the temperature inside the second metal spraying chamber is set to 50~150° C.; argon is floated into the second metal spraying chamber at a flux of about 75 sccm to about 150 sccm; a stainless steel target in the second metal spraying chamber is evaporated at a power from 1 kW to 10 kW, to deposit the protection layer on the electromagnetic shielding layer.

17. The method of claim 9, further including a step of cleaning the plastic substrate by argon plasma cleaning between providing a plastic substrate and depositing the nickel vanadium layer on the plastic substrate.

18. The method of claim 17, wherein during cleaning the plastic substrate, the plastic substrate is retained in a plasma cleaning chamber, the vacuum level inside the plasma cleaning chamber is set to $5.0 \times 10^{-3}$ Pa, pure argon is floated into the plasma cleaning chamber at a flux of about 100 sccm to 300 sccm, and an ion source in the plasma cleaning chamber is started at a power of about 700 w to about 1000 w for about 0.5 minutes to about 10 minutes, to clean the plastic substrate.

* * * * *